US008705309B2

(12) United States Patent
Sheets et al.

(10) Patent No.: US 8,705,309 B2
(45) Date of Patent: Apr. 22, 2014

(54) STATE-MONITORING MEMORY ELEMENT

(71) Applicant: Cypress Semiconductor Corporation, San Jose, CA (US)

(72) Inventors: Michael Sheets, Seattle, WA (US); Timothy John Williams, Bellevue, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/915,464

(22) Filed: Jun. 11, 2013

(65) Prior Publication Data
US 2013/0336081 A1 Dec. 19, 2013

Related U.S. Application Data

(63) Continuation of application No. 13/303,112, filed on Nov. 22, 2011, now Pat. No. 8,462,576, which is a continuation of application No. 11/857,947, filed on Sep. 19, 2007, now Pat. No. 8,111,577.

(60) Provisional application No. 60/912,399, filed on Apr. 17, 2007.

(51) Int. Cl.
*G11C 5/14* (2006.01)
(52) U.S. Cl.
USPC ............................ 365/228; 365/226; 365/154
(58) Field of Classification Search
USPC ............................ 365/226–229, 189.09, 154
See application file for complete search history.

(56) References Cited

U.S. PATENT DOCUMENTS

| 4,843,592 | A | | 6/1989 | Tsuaki et al. | |
|---|---|---|---|---|---|
| 4,879,505 | A | | 11/1989 | Barrow et al. | |
| 4,951,171 | A | | 8/1990 | Tran et al. | |
| 4,972,372 | A | | 11/1990 | Ueno | |
| 5,079,744 | A | * | 1/1992 | Tobita et al. | 365/201 |
| 5,386,575 | A | | 1/1995 | Shinkai et al. | |
| 5,463,591 | A | | 10/1995 | Aimoto et al. | |
| 5,500,823 | A | * | 3/1996 | Martin et al. | 365/201 |
| 5,530,673 | A | | 6/1996 | Tobita et al. | |
| 5,708,589 | A | | 1/1998 | Beauvais | |

(Continued)

OTHER PUBLICATIONS

U.S. Appl. No. 10/945,709: "Method And an Apparatus to Detect Low Voltage" David G. Wright et al., filed Sep. 20, 2004; 36 pages.

(Continued)

*Primary Examiner* — Harry W Byrne

(57) ABSTRACT

Embodiments of the invention relate to a state-monitoring memory element. The state-monitoring memory element may have a reduced ability to retain a logic state than other regular memory elements on an IC. Thus, if the state-monitoring memory elements fails or loses state during testing, it may be a good indicator that the IC's state retention may be in jeopardy, possibly requiring the IC to be reset. The state-monitoring memory element may be implemented by degrading an input voltage supply to the state-monitoring memory element across a diode and/or a transistor. One or more current sources may be used to stress the state-monitoring memory element. A logic analyzer may be used to analyze the integrity of the state-monitoring memory element and trigger appropriate actions in the IC, e.g., reset, halt, remove power, interrupt, responsive to detecting a failure in the state-monitoring memory element. Multiple state-monitoring memory elements may be distributed in different locations on the IC for better coverage.

11 Claims, 4 Drawing Sheets

(56) References Cited

U.S. PATENT DOCUMENTS

| | | | |
|---|---|---|---|
| 5,717,256 | A | 2/1998 | Okumura et al. |
| 5,761,128 | A | 6/1998 | Watanabe |
| 5,896,330 | A | 4/1999 | Gibson |
| 5,956,279 | A | 9/1999 | Mo et al. |
| 5,963,503 | A | 10/1999 | Lee |
| 6,091,227 | A | 7/2000 | Beard |
| 6,101,617 | A | 8/2000 | Burckhartt et al. |
| 6,208,572 | B1 | 3/2001 | Adams et al. |
| 6,215,352 | B1 | 4/2001 | Sudo |
| 6,256,754 | B1 | 7/2001 | Roohparvar |
| 6,348,798 | B1 | 2/2002 | Daw |
| 6,407,953 | B1 | 6/2002 | Cleeves |
| 6,650,581 | B2 | 11/2003 | Hong et al. |
| 6,731,552 | B2 | 5/2004 | Perner |
| 6,754,101 | B2 | 6/2004 | Terzioglu et al. |
| 6,853,598 | B2 | 2/2005 | Chevallier |
| 6,862,240 | B2 | 3/2005 | Burgan |
| 6,885,952 | B1 | 4/2005 | Hayes |
| 6,891,355 | B2 | 5/2005 | Kemahan |
| 6,901,014 | B2 | 5/2005 | Son et al. |
| 7,123,033 | B1 | 10/2006 | Wright |
| 7,193,901 | B2 | 3/2007 | Ruby et al. |
| 7,243,118 | B2 | 7/2007 | Lou |
| 7,283,410 | B2 * | 10/2007 | Hsu et al. ............ 365/201 |
| 7,301,835 | B2 | 11/2007 | Joshi et al. |
| 7,376,001 | B2 | 5/2008 | Joshi et al. |
| 7,616,509 | B2 | 11/2009 | Qureshi et al. |
| 8,024,678 | B1 | 9/2011 | Taylor et al. |
| 8,026,739 | B2 | 9/2011 | Sullam et al. |
| 8,111,577 | B2 * | 2/2012 | Sheets et al. ............ 365/228 |
| 2005/0027776 | A1 | 2/2005 | Lou |
| 2007/0091698 | A1 | 4/2007 | Watanabe et al. |
| 2008/0049507 | A1 | 2/2008 | Lee |
| 2008/0263319 | A1 | 10/2008 | Snyder et al. |
| 2008/0263334 | A1 | 10/2008 | Synder et al. |
| 2008/0288755 | A1 | 11/2008 | Synder et al. |

OTHER PUBLICATIONS

U.S. Appl. No. 11/857,947: "System Comprising a State-Monitoring Memory Element" Michael Sheets et al., filed Sep. 19, 2007; 18 pages.

Calhoun et al., "Standby Power Reduction Using Dynamic Voltage Scaling and Canary Flip-Flop Structures," IEEE Journal of Solid-State Circuits, vol. 39, No. 9, Sep. 2004, pp. 1504-1511.

Enomoto et al., "A Self-Controllable Voltage Level (SVL) Circuit and Its Low-Power High-Speed CMOS Circuit Applications," IEEE Journal of Solid-State Circuits, vol. 38, No. 7, Jul. 2003, pp. 1220-1226.

International Search Report for International Application No. PCT/US08/60698 dated Sep. 5, 2008; 2 pages.

Tektronix, Tektronix Logic Analyzers TLA7000 Series Data Sheet, Jun. 23, 2009.

USPTO Final Rejection for U.S. Appl. No. 10/945,709 dated Feb. 9, 2006; 14 pages.

USPTO Final Rejection for U.S. Appl. No. 11/857,947 dated Jan. 4, 2011; 14 pages.

USPTO Final Rejection for U.S. Appl. No. 11/857,947 dated Oct. 14, 2009; 22 pages.

USPTO Non Final Rejection for U.S. Appl. No. 10/945,709 dated Sep. 7, 2005; 14 pages.

USPTO Non Final Rejection for U.S. Appl. No. 11/857,947 dated Mar. 30, 2009; 18 pages.

USPTO Non Final Rejection for U.S. Appl. No. 11/857,947 dated Jul. 21, 2010; 15 pages.

USPTO Non-Final Rejection for U.S. Appl. No. 11/857,947 dated Feb. 3, 2010; 23 pages.

USPTO Non-Final Rejection for U.S. Appl. No. 13/303,112 dated Oct. 11, 2012; 20 pages.

USPTO Notice of Allowance for U.S. Appl. No. 10/945,709 dated Jun. 20, 2006; 7 pages.

USPTO Notice of Allowance for U.S. Appl. No. 11/857,947 dated Mar. 30, 2011; 8 pages.

USPTO Notice of Allowance for U.S. Appl. No. 11/857,947 dated Jul. 8, 2011; 7 pages.

USPTO Notice of Allowance for U.S. Appl. No. 11/857,947 dated Dec. 23, 2011; 7 pages.

USPTO Notice of Allowance for U.S. Appl. No. 13/303,112 dated Jan. 17, 2013; 8 Pages.

USPTO Notice of Allowance for U.S. Appl. No. 13/303112 dated Apr. 12, 2013; 9 pages.

Written Opinion of the International Searching Authority for International Application No. PCT/US08/60698 mailed Sep. 5, 2008; 4 pages.

* cited by examiner

STATE-MONITORING MEMORY ELEMENT

RELATED APPLICATIONS

This application is a continuation of U.S. application Ser. No. 13/303,112, filed Nov. 22, 2011, now U.S. Pat. No. 8,462, 576, issued Jun. 11, 2013, which is a continuation of U.S. application Ser. No. 11/857,947, filed Sep. 19, 2007, now U.S. Pat. No. 8,111,577, issued Feb. 7, 2012 which claims priority to U.S. Provisional Patent Application No. 60/912, 399, filed Apr. 17, 2007, all of which are incorporated by reference herein in their entirety.

TECHNICAL FIELD

The present disclosure relates generally to Integrated Circuits (ICs), and more particularly to a state-monitoring memory element to detect potential failures in ICs.

BACKGROUND

In many IC applications, some means for monitoring a voltage state of certain elements on the IC are needed. For example, when an input voltage supply to one or more elements on the IC falls below a certain voltage threshold, a "reset" signal might be generated to reset the IC in order to avoid damage to the IC.

A voltage detector circuit implementing a low voltage detection function may be used to monitor the voltage state of the elements on the IC. The voltage detector circuit may include a voltage divider coupled to a field effect transistor (FET). A scaled input voltage taken across the voltage divider may be supplied to the gate input of the FET. If an input voltage supply is high, the FET will be turned on, in which case the voltage detector circuit does not issue a reset signal. On the other hand, if the input voltage supply drops below a certain voltage threshold, the FET will be turned off, and the voltage detector circuit generates a reset signal to reset the IC. The above-described voltage detector circuit incurs high power consumption since the resistive voltage divider constantly drains current from the input voltage supply. In addition, since the voltage detector circuit requires a certain voltage threshold to turn on the FET, the voltage threshold required to trigger the reset signal may not be low enough. As a result, unnecessary reset signal may occur at the output of the voltage detector circuit.

DESCRIPTION OF EXAMPLE EMBODIMENTS

Overview

A system comprises at least one state-monitoring memory element having a reduced ability to retain a logic state compared to a normal memory element; and a logic analyzer to detect a failure in the state-monitoring memory element and to generate an indicator of failure responsive to the detection. The system may comprise a voltage supply circuit to degrade an input voltage and to provide the degraded input voltage to the state-monitoring memory element, wherein the voltage supply circuit comprises one of a diode or a transistor. Alternatively, the system may comprise at least one current source to stress the state-monitoring memory element.

A method includes configuring the state-monitoring memory element to have a reduced ability to retain a logic state compared to a normal memory element; detecting a failure in the state-monitoring memory element; and generating an indicator of failure responsive to detecting the failure in the state-monitoring memory element. The method includes degrading an input voltage across one of a diode or a transistor. At least one current source may be coupled to the state-monitoring memory element to stress the state-monitoring memory element. The method further includes presetting the state-monitoring memory element to a logic state and detecting if the state-monitoring memory element loses the preset logic state after a power transient.

BRIEF DESCRIPTION OF THE DRAWINGS

The foregoing and other objects, advantages and features will become more readily apparent by reference to the following detailed description in conjunction with the accompanying drawings.

DETAILED DESCRIPTION

Figure 1:
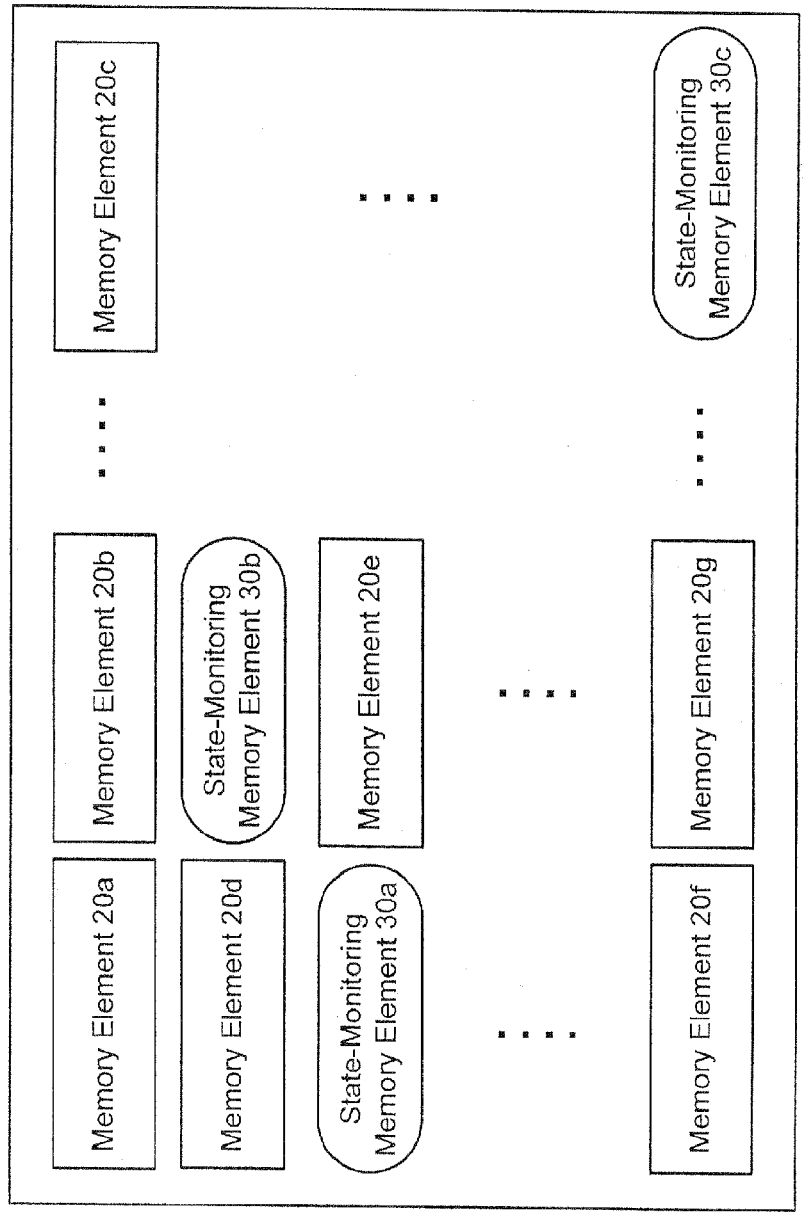
FIG. 1 is a schematic block diagram illustrating an example IC 100 having state monitoring memory elements according to embodiments of the invention.

FIG. 1 is a schematic block diagram illustrating an example integrated circuit (IC) 100 having state-monitoring memory elements according to embodiments of the invention. It should be recognized that FIG. 1 may include other elements, which are not illustrated in order to simplify the figures and which may not be necessary to understand the example system disclosed below.

Figure 3:
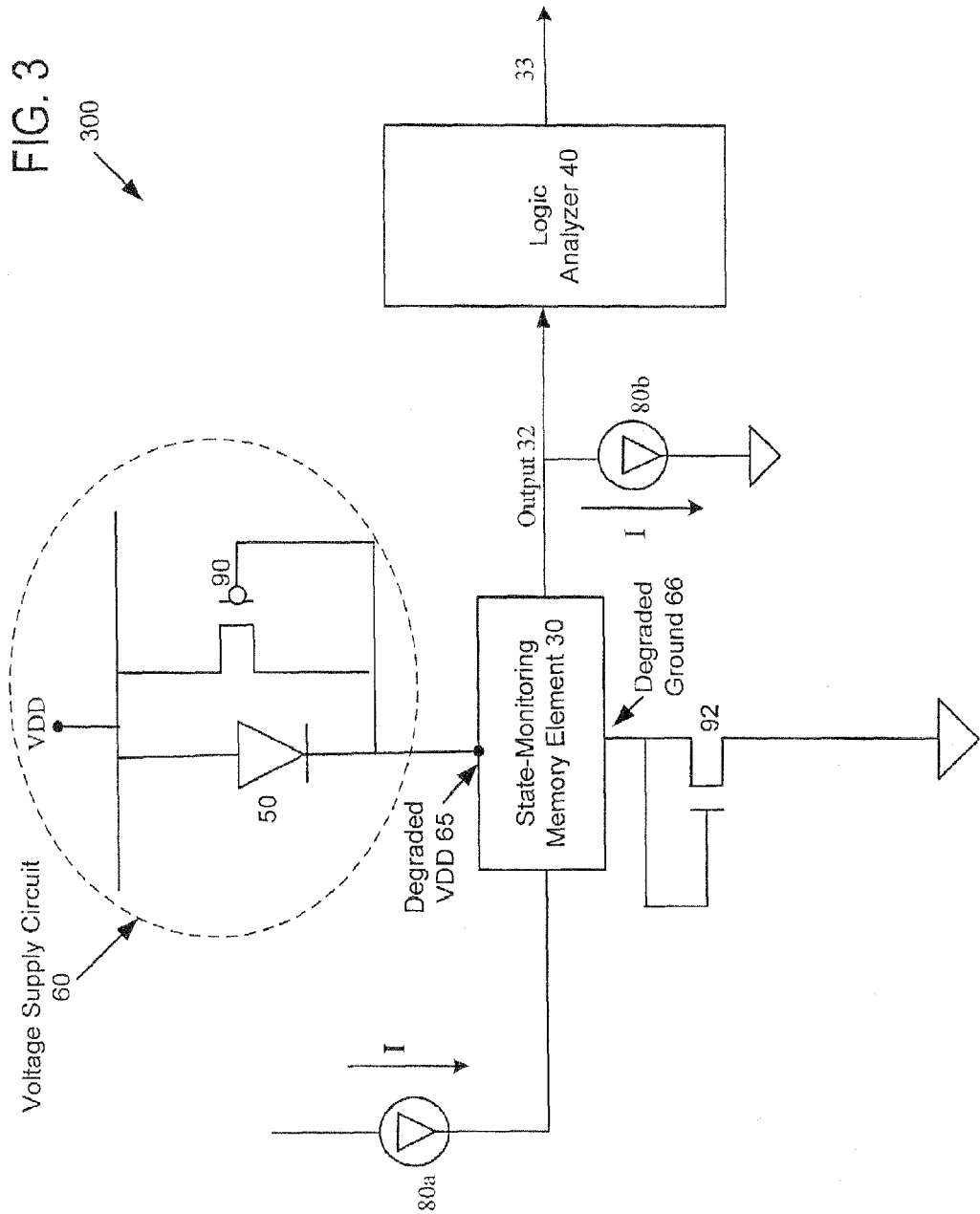
FIG. 3 is a schematic block diagram illustrating an example circuit 300 for configuring the state-monitoring memory element 30 of FIG. 1.

Referring to FIG. 1, the IC 100 may include one or more regular memory elements, such as 20a-20g. Each regular memory element 20a-20g may be a register, a memory cell, a latch, an array of registers or memory cells, and/or the like. The IC 100 may additionally include one or more state-monitoring memory elements, such as 30a-30c. Each state-monitoring memory element 30a-30c may be configured to have a reduced ability to retain a logic state than the regular memory elements 20a-20g in the IC 100. For example, a regular memory element, such as 20a-20g, may fail to operate or lose its logic state when an input voltage supply to the regular memory element drops to approximately 1.0 volt, whereas a state-monitoring memory element, such as 30a-30c, may fail at an input voltage supply of approximately 1.2 volts. In others words, a state-monitoring memory element 30a-30c may be more sensitive to a voltage drop than a regular memory element 20a-20g such that the state-monitoring memory element 30a-30c fails earlier than a regular memory element 20a-20g as the input voltage supply degrades over time. In some embodiments, if any one of the state-monitoring memory elements 30a-30c fails or loses state, it may be a good indicator that the IC 100's state retention may be in jeopardy, possibly requiring the IC 100 to be reset. FIG. 3 describes how the state-monitoring memory element 30 may be configured to have a reduced ability to retain a memory state than other regular memory element 20 in the IC 200, such that the state-monitoring memory element 30 fails before the regular memory element 20 in the IC 100.

Although FIG. 1 shows only three state-monitoring memory elements 30a-30c, the IC 100 may include any number of state-monitoring memory elements. Each of the state-monitoring memory elements 30a-30c may be implemented as a register, a memory cell, a latch, an array of registers or memory cells, and/or the like. In some embodiments, the state-monitoring memory elements 30a-30c may be distributed in different locations of the IC 100 for better coverage.

Figures 2A, 2B, 2C:
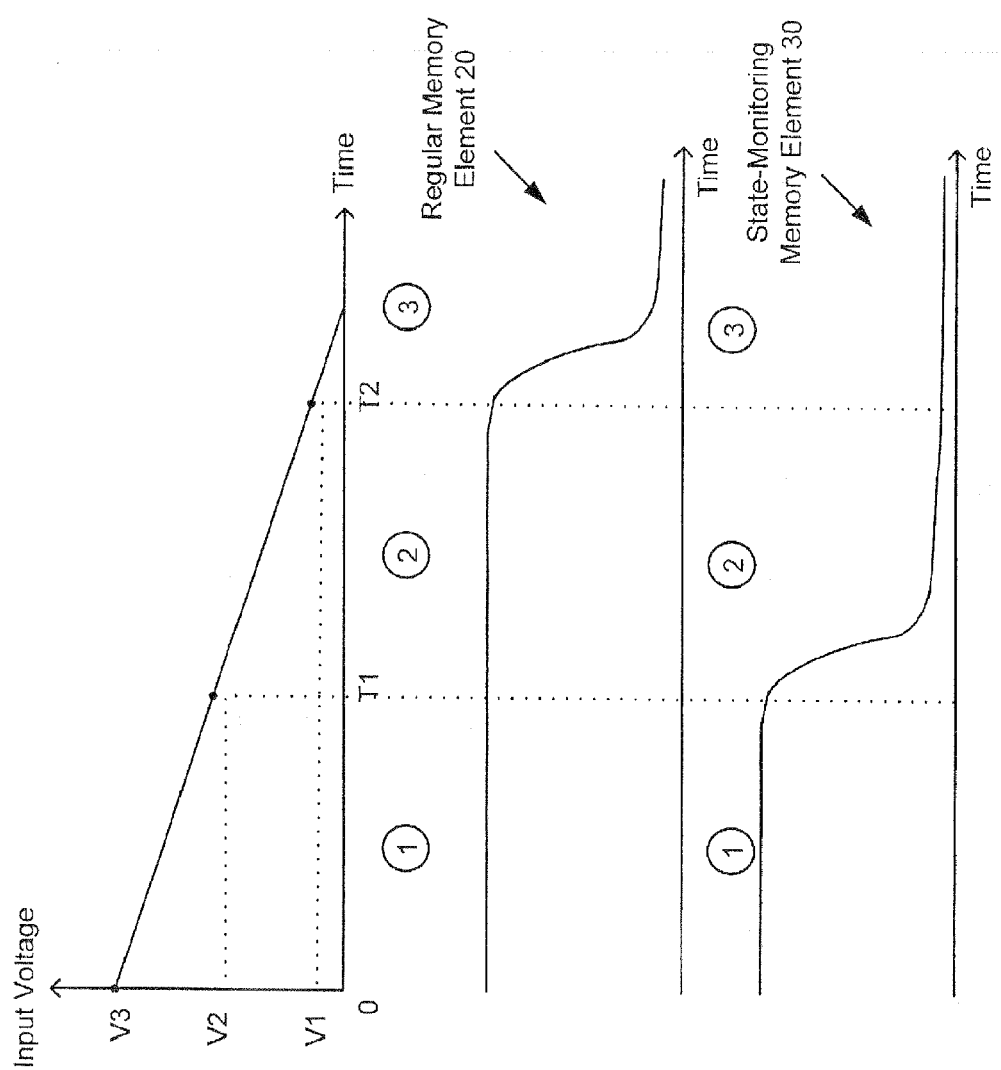
FIGS. 2A, 2B, and 2C illustrate further details of the state-monitoring memory element 30 of FIG. 1.

FIGS. 2A, 2B, and 2C illustrate the effects of a voltage drop on a state-monitoring memory element 30 and a regular memory element 20 of FIG. 1. FIG. 2A shows a voltage curve, in which the input voltage declines linearly as a function of time. In FIG. 2A, the input voltage value V1 is less than the input voltage value V2, which is in turn less than the input voltage value V3. The voltages curve of FIG. 2A represents an input voltage supply to the regular memory element 20 and the state-monitoring memory element 30. The voltage curve of FIG. 2 may also decline as another function of time.

FIGS. 2B and 2C respectively shows the effect of a voltage drop on the regular memory element 20 and the state-monitoring element 30. In FIG. 2B, the regular memory element 20 may continue to operate or keep its memory state, e.g., regions 1 and 2, as long as the input voltage is above the input voltage value V1. When the input voltage falls below the input voltage value V1 at time T2, the regular memory element 20 may fail or lose its memory state, e.g., region 3. On the other hand, as shown in FIG. 2C, the state-monitoring memory element 30 may fail to operate or lose its memory state when the input voltage falls below the input voltage value V2 at time T1. In others words, the state-monitoring memory element 30 may be more sensitive to a voltage drop than the regular memory element 20 such that the state-monitoring memory element 30 fails earlier than a regular memory element 20 as the input voltage degrades over time. Thus when the state-monitoring memory element 30 fails, it may be a good indicator that the IC 100's state retention may be in jeopardy, possibly resulting in a reset of the IC 100.

FIG. 3 is a schematic block diagram illustrating an example circuit 300 for configuring the state-monitoring memory element 30 of FIG. 1. Referring to FIG. 3, the circuit 300 may include a voltage supply circuit 60 for supplying voltages to the state-monitoring memory element 30. The voltage supply circuit 60 receives a voltage VDD derived from a voltage source (not shown), such as a battery. The voltage VDD may be degraded to some voltage level, e.g., degraded VDD 65, which may be supplied to the positive power supply of the state-monitoring memory element 30. The state-monitoring memory element 30 may be implemented as a register, a memory cell, a latch, an array of registers or memory cells, and/or the like.

As shown in FIG. 3, the voltage VDD may be degraded by coupling a diode 50 to the positive power supply of the state-monitoring memory element 30. When the voltage VDD exceeds a threshold value of the diode 50, the diode 50 would be turned on to effectuate a voltage drop, resulting in the degraded VDD 65. Alternatively, the voltage VDD may be degraded by coupling a transistor device, e.g., a p-channel metal-oxide-semiconductor field-effect transistor (PMOS) 90, to the state-monitoring memory element 30. The amount of voltage drop may depend on a threshold voltage of the transistor device and a gate bias voltage of the transistor device. For example, when the voltage VDD exceeds a certain value, the PMOS 90 would be turned on to effectuate a voltage drop, resulting in the degraded VDD 65. Although FIG. 3 shows that a PMOS 90 is used to degrade the voltage VDD, an n-channel MOSFET (NMOS) may be used to degrade the voltage VDD.

Similarly, a diode (not shown) and/or a transistor device (e.g., NMOS transistor 92) may be coupled to the negative power supply of the state-monitoring memory element 30 to degrade the voltage supply to the state-monitoring memory element 30 using the same principle described above. For example, as shown in FIG. 3, the NMOS transistor 92 may be coupled to the negative power supply of the state-monitoring memory element 30 such that when the gate bias voltage of the NMOS 92 exceeds its threshold voltage, the NMOS 92 may be turned on to effectuate a voltage drop, e.g., degraded ground 66.

One or more current sources, such as 80a, 80b, may be coupled to the state-monitoring memory element 30 to stress the state-monitoring memory element 30 due to the load current that flows through the state-monitoring memory element 30. These current sources may degrade the voltage at output 32 below the degraded VDD 65, and thus compromising the state-retention ability of the state-monitoring memory element 30. It should be noted that the current in the current sources 80a and 80b may be small, e.g. on the order of 10 nA.

The state-monitoring memory element 30 may be initialized by writing it with a logic state, e.g., "1". After degrading the voltage supply of the state-monitoring memory element 30 to a certain voltage value, the state-monitoring memory element 30 may fail or lose its memory state, in which case the state-monitoring memory element 30 may output a "0 to the logic analyzer 40 (assuming that the state-monitoring memory element has been initialized with a logic state of "1"). It should be noted that the state-monitoring memory element 30 may be initialized to a logic state other than logic state "1", e.g., logic state "0", such that failures may be detected on either logic state "1" or "0". The logic analyzer 40 analyzes the output 32 of the state-monitoring memory element 30 to determine whether the state-monitoring memory element 30 has failed or lost its memory state. If the logic analyzer 40 detects a failure in the state-monitoring memory element 30, the logic analyzer 40 may issue a signal 33 to trigger appropriate actions in the IC 100, such as resetting the IC 100, halting the IC 100, removing power, or generating an interrupt.

The above describes various means that may be used to degrade the state-retention ability of the state-monitoring element 30, such as by coupling a diode, a transistor device, current sources, or a combination thereof, to the state-monitoring memory element 30. The voltage threshold required to trigger a reset signal may be controlled to reduce the occurrence of unnecessary resets in the IC 100. In addition, the circuit 300 consumes less power than the resistive voltage divider mentioned earlier.

Figure 4:
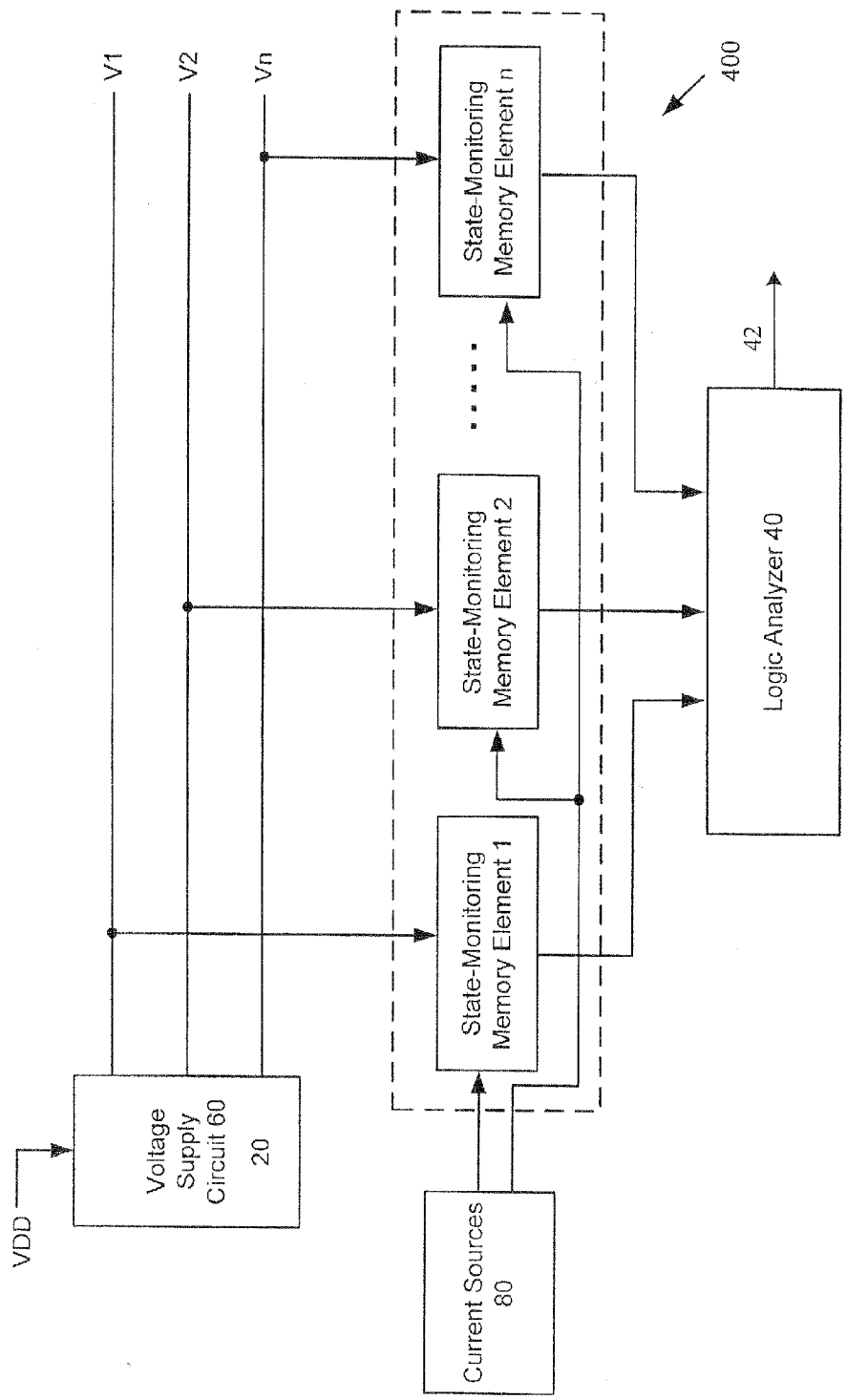
FIG. 4 is a schematic block diagram illustrating an array of the state-monitoring memory element 30 of FIG. 1.

FIG. 4 is a schematic block diagram illustrating an array of the state-monitoring memory element 30 of FIG. 1. Referring to FIG. 4, the IC 100 may include an array 400 of state-monitoring memory elements, such as state-monitoring memory element 1, state-monitoring memory element 2, . . . , and state-monitoring memory element n, where n>=3. The IC 100 may also include a voltage supply circuit 60 to generate various input voltages, such as V1, V2, . . . , and Vn, where n>=3, each representing a same or different voltage level. Each of these input voltages V1, V2, Vn may be supplied to a respective state-monitoring memory element. Additionally, each of the respective state-monitoring memory elements may be coupled to one or more current sources 80. The current sources 80 may stress the state-monitoring memory element as a result of the load current that flows through the state-monitoring memory element. Consequently, the current sources 80 may cause the respective state-monitoring memory element to be more vulnerable to voltage degradation and thus more likely to fail when the input voltages V1, V2, . . . , Vn degrade to a certain voltage value. State-monitoring memory element 1, state-monitoring memory element 2, . . . , and state-monitoring memory element n may each be implemented as a register, a memory cell, a latch, an array of registers or memory cells, and/or the like.

A logic analyzer 40 is used in the IC 100 to analyze the integrity of the respective state-monitoring memory elements. In some embodiments, state-monitoring memory element 1, state-monitoring memory element 2, . . . , and state-monitoring memory element n, may each be initialized by writing to it a logic state, e.g., 1. After degrading the input voltages V1, V2, Vn for the respective state-monitoring memory element to a certain voltage value, one or more of these state-monitoring memory elements may fail or lose its memory state. For example, if the initial logic state in the respective state-monitoring memory elements is "1", the state-monitoring element may lose the original logic state due to a voltage drop in the respective input voltages, in which case the logic state in the state-monitoring memory element may be "0". It should be noted that these state-monitoring memory elements may each be initialized to a logic state other than logic state "1", e.g., logic state "0", such that failures may be detected on either logic state "1" or "0". The logic analyzer 40 analyzes the output of the respective state-monitoring memory elements to determine whether one or more of the state-monitoring memory elements have lost the memory state. If the logic analyzer 40 detects that any one of these state-monitoring memory elements fails or loses its memory state, the logic analyzer 40 may issue a signal 42 to trigger appropriate actions in the IC 100, such as resetting the IC, halting the IC, removing power, or generating an interrupt. For example, a reset signal may be sent to a central processor unit (not shown) to possibly reset the IC 100. The array of state-monitoring memory elements may be distributed in different locations in the IC 100 for better coverage.

Embodiments of the invention relate to a state-monitoring memory element for detecting potential IC failures. Embodiments of the invention allow for an accurate detection of potential IC failures, while consuming less power. The state-monitoring memory element may have a reduced ability to retain a logic state than other regular memory elements on an IC. Thus, if the state-monitoring memory elements fails or loses state during testing, it may be a good indicator that the IC's state retention may be in jeopardy, possibly requiring the IC to be reset. The state-monitoring memory element may be implemented as a register, a memory cell, a latch, or an array of registers or memory cells. The state-monitoring memory element may be degraded by dropping an input voltage supply across a diode, a transistor, or a combination of both. At least one current source may be used to stress the state-monitoring memory element. A logic detector may be used to analyze the integrity of the state-monitoring memory element. The logic analyzer may trigger appropriate actions in the IC responsive to detecting a failure of the state-monitoring memory element. Multiple state-monitoring memory elements may be distributed in different locations on the IC for better coverage.

Further modifications and alternative embodiments of this invention will be apparent to those skilled in the art in view of this description. Accordingly, this description is to be construed as illustrative only and is for the purpose of teaching those skilled in the art the manner of carrying out the invention. Various changes may be made in the shape, size and arrangement and types of components or devices. For example, equivalent elements or materials may be substituted for those illustrated and described herein, and certain features of the invention may be utilized independently of the use of other features, all as would be apparent to one skilled in the art after having the benefit of this description of the invention. Alternative embodiments are contemplated and are within the spirit and scope of the following claims.

What is claimed is:

1. An apparatus comprising:
a state-monitoring memory element comprising a first power supply connection and a second power supply connection between which is applied an input voltage supply;
a circuit element coupled to the state-monitoring memory element to effectuate a voltage drop in the input voltage supply to provide a degraded voltage supply between the first power supply connection and the second power supply connection of the state-monitoring element, wherein the circuit element is configured to cause the state-monitoring memory element to lose a logic state before a normal memory element when the input voltage supply drops below a threshold value; and
a failure detection element coupled to the state-monitoring element, wherein the failure detection element is configured to detect a failure by the state-monitoring memory element to retain the logic state and, responsive to the detection, to generate an indication of the failure.

2. The apparatus of claim 1, wherein the circuit element comprises a voltage supply circuit configured to provide a degraded input supply voltage on the first power supply connection that results in the degraded voltage supply being applied between the first power supply connection and the second power supply connection of the state-monitoring element.

3. The apparatus of claim 2, wherein the voltage supply circuit comprises at least one of a diode or a transistor device.

4. The apparatus of claim 1, wherein the circuit element comprises a voltage supply circuit configured to provide a degraded ground on the second power supply connection that results in the degraded voltage supply being applied between the first power supply connection and the second power supply connection of the state-monitoring element.

5. The apparatus of claim 4, wherein the voltage supply circuit comprises at least one of a diode or a transistor device.

6. The apparatus of claim 1, wherein the circuit element comprises at least one of a diode, a transistor device, or a current source.

7. The apparatus of claim 1, wherein the state-monitoring memory element is at least one of a register, a memory cell, a latch, an array of registers, or an array of memory cells.

8. The apparatus of claim 1, wherein the failure detection element is adapted to issue a reset signal responsive to detecting the failure in the state-monitoring memory element.

9. The apparatus of claim 1, wherein the failure detection element is adapted to issue an interrupt to a system processor with an indication of the failure responsive to detecting the failure in the state-monitoring memory element.

10. An integrated circuit comprising:
a state-monitoring memory element comprising a first power supply connection and a second power supply connection between which is applied an input voltage supply;
a plurality of normal memory elements;
a circuit element coupled to the state-monitoring memory element to effectuate a voltage drop in the input voltage supply to provide a degraded voltage supply between the first power supply connection and the second power supply connection of the state-monitoring element, wherein the circuit element is configured to cause the state-monitoring memory element to lose a logic state before the plurality of normal memory elements when the input voltage supply drops below a threshold value; and a failure detection element coupled to the state-monitoring element, wherein the failure detection element is configured to detect a failure by the state-monitoring memory element to retain the logic state and, responsive to the detection, to generate an indication of the failure.

11. The integrated circuit of claim 10, wherein the state-monitoring memory element and the plurality of normal memory elements are at least one of registers, memory cells, or latches.

* * * * *